United States Patent [19]
Osmon et al.

[11] Patent Number: 5,287,345
[45] Date of Patent: Feb. 15, 1994

[54] DATA HANDLING ARRAYS

[75] Inventors: Peter E. Osmon; Paul Anderson, both of London, United Kingdom

[73] Assignee: The City University, London, England

[21] Appl. No.: 548,979

[22] PCT Filed: Feb. 3, 1989

[86] PCT No.: PCT/GB89/00106

§ 371 Date: Jul. 31, 1990

§ 102(e) Date: Jul. 31, 1990

[87] PCT Pub. No.: WO89/07298

PCT Pub. Date: Aug. 10, 1989

[30] Foreign Application Priority Data

Feb. 4, 1988 [GB] United Kingdom ............... 8802447
Sep. 28, 1988 [GB] United Kingdom ............... 8822785

[51] Int. Cl.$^5$ ............................................. H04L 12/56
[52] U.S. Cl. ........................................ 370/60; 395/800
[58] Field of Search ............... 370/60, 94.1, 58.1, 370/58.2; 395/800, 325, 650; 365/63

[56] References Cited

U.S. PATENT DOCUMENTS

| | | | |
|---|---|---|---|
| 3,473,160 | 10/1969 | Wahlstrom | 395/800 |
| 3,962,706 | 6/1976 | Dennis et al. | 395/650 |
| 4,007,452 | 2/1977 | Hoff, Jr. | 365/63 |
| 4,020,469 | 4/1977 | Manning | 395/800 |
| 4,237,447 | 12/1980 | Clark | 370/825.52 |
| 4,466,060 | 8/1984 | Riddle | 395/325 |
| 4,692,917 | 9/1987 | Fujioka | 370/60 |
| 4,707,825 | 11/1987 | Amstutz et al. | 370/60 |
| 4,890,281 | 12/1989 | Balboni et al. | 370/61 |
| 4,893,304 | 1/1990 | Giacopelli et al. | 370/94.1 |
| 4,918,686 | 4/1990 | Hayashi et al. | 370/60 |
| 4,920,531 | 4/1990 | Isono et al. | 370/94.1 |
| 4,922,488 | 5/1990 | Niestegge | 370/60 |

FOREIGN PATENT DOCUMENTS

| | | |
|---|---|---|
| 0109850 | 5/1984 | European Pat. Off. . |
| 0206512 | 12/1986 | European Pat. Off. ..... H04L 11/20 |
| 0240864 | 10/1987 | European Pat. Off. . |
| 0416714A2 | 3/1991 | European Pat. Off. . |
| 59-103166 | 10/1984 | Japan . |
| 62-179041 | 1/1988 | Japan . |
| 83/02019 | 6/1983 | PCT Int'l Appl. . |
| WO86/04701 | 8/1986 | PCT Int'l Appl. . |
| WO87/05724 | 9/1987 | PCT Int'l Appl. . |

OTHER PUBLICATIONS

Patent Abstracts of Japan, vol. 12, No. 25 (P-659)(2872) Jan. 26, 1988 and JP,A,62 179 041 (NEC Corporation) Aug. 6, 1987.

Patent Abstracts of Japan, vol. 8, No. 219 Oct. 5, 1984 and JP,A,59 103 166 (Fujitsu) Jun. 14, 1984.

"An Interconnection Scheme For a Tightly Coupled Massively Parallel Computer Network"—Jul. 10, 1985, Harris et al.

"A Regular WSI-Node Architecture"—Aug. 1987, Trobec et al.

"A Reconfigurable and Fault-Tolerant VLSI Multi--Processor Array" 1981, Koren.

"Routing Management in Very Large Scale Networks'-'—Sep. 11-12, 1987 Garcia, Luna, Aceves.

Primary Examiner—Douglas W. Olms
Assistant Examiner—Dang Ton
Attorney, Agent, or Firm—Nixon & Vanderhye

[57] ABSTRACT

An array of interconnected node units for data handling, processing or data storage may be formed as an integrated circuit on a semiconductor wafer or as separate elements of a fault-tolerant computer. Each node unit includes a controlled switch for routing signal packets to destination node units whose addresses are included in the packets. Some node units include a data processor and/or memory together with a packet generator and a packet receiver. The controller of a switch stores details of which adjacent node units are not working and directs signal packets on paths round the non-working node units. The signal packets include a handedness bit to indicate to which side of a non-working node unit they are to be directed. The handedness bit is changed by node units at the edge of the array.

15 Claims, 4 Drawing Sheets

A WAFER OF SILICON

DATA HANDLING ARRAYS

BACKGROUND OF THE INVENTION

1. Field of the Invention

This invention relates to data handling arrays and especially but not exclusively to fault tolerant data processing arrays.

2. Description of Related Art

In order to provide a computer apparatus capable of processing data at a very high speed, it has been proposed to provide the computer circuitry in the form of a plurality of separate data processing means which operate simultaneously to perform different parts of the processing required at the same time. In order to make the best use of the processing speed of the individual processing means it is desirable to have very high speed communication between the processing means. Very many short interconnections are required between the processing means to provide the high speed communication and one way of achieving such interconnections is to include all the processing means in a single integrated circuit—formed on a slice of semi-conductor material as a so-called wafer scale integrated circuit. An advantage of such a construction is that the entire slice can be processed at the same time, thereby keeping to a minimum the cost of manufacture of the system. Most conveniently the processing means formed on the slice each contain substantially the same circuit with a processor and memory The disadvantage with such an arrangement lies in the fact that dislocations due to the presence of impurities can occur in the crystal structure of the semi-conductor material of which the slice is made and such dislocations can prevent the processing means from functioning properly. The number of such dislocations depends on the area of semi-conductor material involved.

Therefore, although acceptable yields can be obtained of integrated circuits using for example a 10 mm square chip of silicon, because there would be about 450 such squares on a 5 inch diameter slice, failure of 50 of these individual circuits to work properly may be regarded as acceptable since nearly 90 percent of the production did work.

If, however, all of these circuits are interconnected to form a single unit, some means has to be found of identifying those circuits which do not work and providing communication between the circuits which do work and leaving out those which do not work, so that a functional entity is obtained. Various proposals have been made for testing of individual circuits and then for providing interconnections between only those circuits which have been found to work This technique suffers from the disadvantage that the testing of all of the individual circuits can be time-consuming and also that at least temporary wiring must be provided to enable the results of the tests to be derived from the individual circuits and further wiring then added so that those circuits which do not work can be bypassed.

SUMMARY OF THE INVENTION

It is an object of the present invention to provide improved data handling array.

According to the present invention there is provided an array including a plurality of node units, each including a communication circuit for routing signal packets, each signal packet including an address component representing the address of a destination node unit in the array, and a network of interconnections between the communications circuits of the node units, wherein each communication circuit has a plurality of input circuits respectively for interconnections to the communications circuits of other node units, a plurality of output circuits respectively for interconnections to the communications circuits of other node units, switching means for selectively joining input circuits and output circuits, and control means for the switching means responsive to the address component of a received signal packet to route the packet to a selected output circuit whereby the packet is transferred to a following unit on a route to the destination node unit, characterised in that the control means of a node unit includes means for recording in a signal packet an indication that the direct path to the destination address is blocked by a non-working node unit if such is the case, and for selecting an alternative output circuit interconnected to a working node unit.

The switching means may comprise a single matrix switch where each signal packet is transmitted serially or a plurality of matrix switches where each signal packet is transmitted as one or more groups of bits in parallel. Each matrix switch may comprise a plurality of row conductors joined to a plurality of column conductors at their crossing points by individual transistor switches controlled by the control means.

In an alternative arrangement the switching means may comprise a plurality of input buffer stores and a plurality of output buffer stores with data transferred from the input buffer stores along a common bus to selected output buffer stores under the control of the control means.

The control means of a particular node unit may be arranged to read the address component of a received signal packet and by reference to the address of the particular node unit to determine whether the packet is to be retained by the particular node unit or passed on, and if it is to be passed on to select the interconnection apparently providing the most direct path to the destination node unit.

The control means may store a status indication in respect of the output circuits as to whether the interconnection connected to the particular output circuit leads to a working node unit or not. The status indication may also indicate whether an output circuit leads to a node unit which is temporarily busy with another signal packet, and may transfer the waiting signal packet to a holding buffer store for later transmission.

The control means may be arranged to perform a self-test routine and to transmit to the control means of the adjacent node units a signal that indicates it is working properly after the self-test has been completed satisfactorily. The self-test routine may be performed automatically when the control means is switched on.

The signal packet includes an indication as to whether or not its direct path to its destination has been blocked by a non-working node unit. This indication may be provided by the control means of the node unit preceding the non-working one on the path of the signal packet to its destination. The node unit then selects an alternative output circuit interconnected to a working node unit on a path round the non-working node unit. The control means may calculate the "distance" between the node unit to which it belongs and the destination of the signal packet and enter an indication of that "distance" as part of the packet when the packet's direct path to its destination is blocked. When this change is made the packet is changed from "free" mode to "blocked" mode. The distance bits of the packet may be arranged to be zero if there is no blockage to its direct path and it is in "free" mode, so the presence of a non-zero "distance" in the packet will indicate that its direct path has been blocked and that it is in "blocked" mode. When a packet finds itself in a node unit which is nearer the destination than the "distance" included in it, the packet is reset to "free" mode, the "distance" is reset to zero and the packet takes a direct path from that node unit to its destination if it can. Alternatively, the "distance" may be reset to a value larger than any possible in the array when the packet is following a direct path to its destination; this has the advantage that the test comparison between the "distance" included in the packet and its distance from its destination can be used to ascertain whether or not the packet is to follow the direct path or one round a non-working node unit.

The term "direct path" as used herein is not restricted to a single path nor even to a shortest path to the destination node unit. A path is a direct path to the destination if, in the transfer of a packet from one node unit to the next, the distance of the packet from the destination is reduced. If the control means finds that a selected interconnection leads to a non-working node unit, it next tries other interconnections on a direct path to the destination to see whether any of them leads to a working node unit, and only if none of those other interconnections leads to a working node unit is the packet switched from "free" to "blocked" node as described above.

The signal packet may also contain a "handedness" bit, for example "0" for left and "1" for right. The control means uses the "handedness" bit to determine which side of a non-working node unit it should route the packet. The "handedness" bit may initially be set to "0" so that on encountering a non-working node unit the signal packet is routed by the control means to a path using the interconnection just to the left hand side of the interconnection leading to the non-working node unit or any other non-working node unit; the control means of the node units visited by the signal packet direct the packet in this way, ignoring the destination address in choosing the route, until the packet finds itself in a node unit which is nearer to its destination than the "distance" it contains, when the routing provided by the control means reverts to following a direct path to the destination as mentioned above.

If in following a path round one or more non-working node units a signal packet enters, a working node unit at the edge of the array, the "handedness" bit may be changed so causing the packet to return and seek a way round the non-working node unit or unit in the other direction. This avoids the signal packet following round the periphery of the array when it reaches an edge node unit. The control means of node units at the edge of the array may store an indication of this fact, which may be entered during an initial setting up of the array.

The addresses of the node units may be absolute ones based on that of a reference node unit and the control means of each other node unit may calculate its addresses by reference to the addresses of the node units around it. In another arrangement the addresses of the node units may be stored in ROMs in the units which are programmed during the manufacture of the units. Alternatively, the destination address stored in the packet may be relative to that of the node unit which it is visiting at the time, the control means of each node unit being arranged to adjust the address according to the direction of the interconnection from which the packet was received.

At least some of the node units may include a communication circuit and another circuit having digital data signal packet generation means, digital data signal packet reception means, together with at least one of a processor means, a memory means and an interface means. The array may serve as a large random access memory in which case the other circuit in each node unit should include packet generation and reception means and memory means.

In one example the array is an integrated circuit, possibly a wafer scale integrated (WSI) circuit formed on and in a slice of semiconductor material, such as silicon or gallium arsenide, with transistors, diodes and other circuit elements formed of the semiconductor material. Other integrated circuit technologies which may be employed include optical circuits and superconducting circuits such as Josephson junctions, for example. Although the invention is of especial value where all the node units are formed on a single integrated circuit, it may also be used where the node units are on a plurality of separate integrated circuits to provide a fault-tolerant computer, for example. Alternatively, the node units may consist of the communication circuits only and may be formed on a single integrated circuit with the other circuits, data processing, memory and/or interface formed separately and connected to the different node units.

BRIEF DESCRIPTION OF THE DRAWINGS

Embodiments of the invention will now be described with reference to the accompanying drawings, of which.

DESCRIPTION OF PRESENTLY PREFERRED EMBODIMENTS

Figure 1:
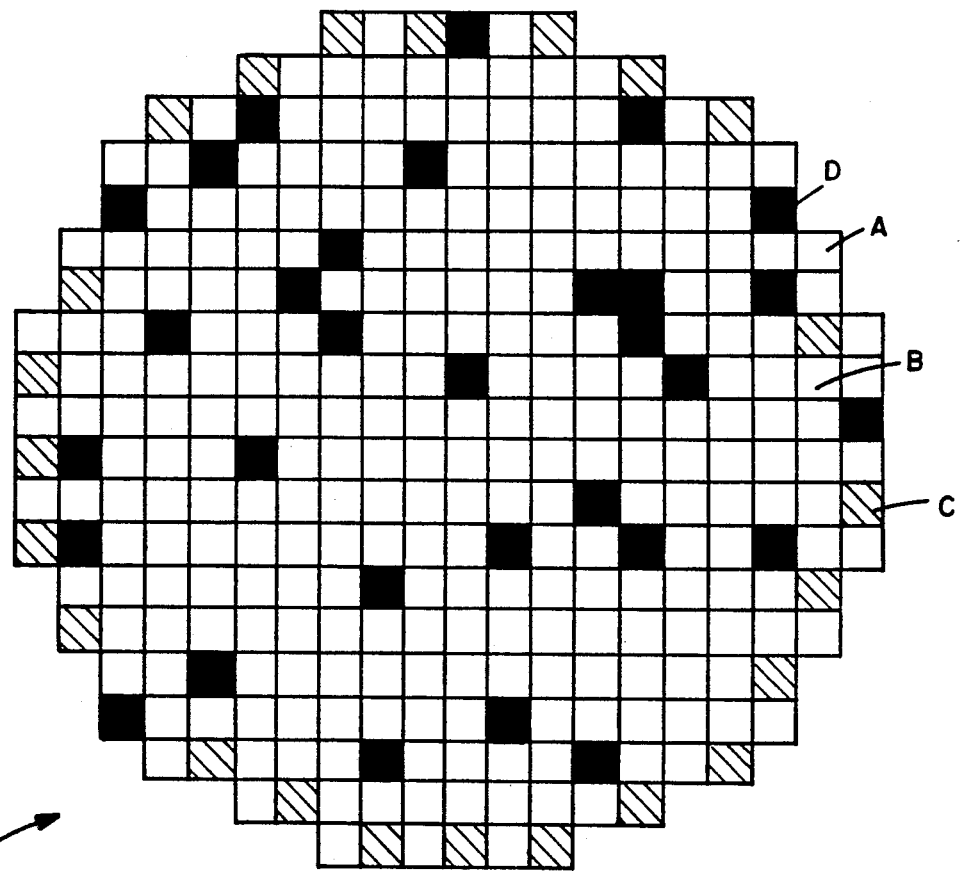
FIG. 1 is a diagram of one example of an array according to the invention.

FIG. 1 is a diagrammatic plan view of a wafer of silicon showing about 300 square areas on its surface. In each of these areas there is formed a node unit of an array. These units are formed by conventional integrated circuit techniques and each of them includes at least a communications circuit and some at least include other circuits. In many examples of the array, all of the node units include a processor means and a memory means, together with digital data signal packet generation means and digital data packet reception means. Most of the node units are of the same construction, and those which are capable of working are indicated in FIG. 1 by unshaded areas such as the areas A and B. Around the edge of the wafer are distributed node units such as that indicated by the reference C which have input and/or output connections to them. As with the area C, these units are indicated in FIG. 1 by dotted shading of the areas. The manufacture of the array includes testing of the node units and the areas occupied by non-working units are indicated by black shading such as the area D.

Figure 2:
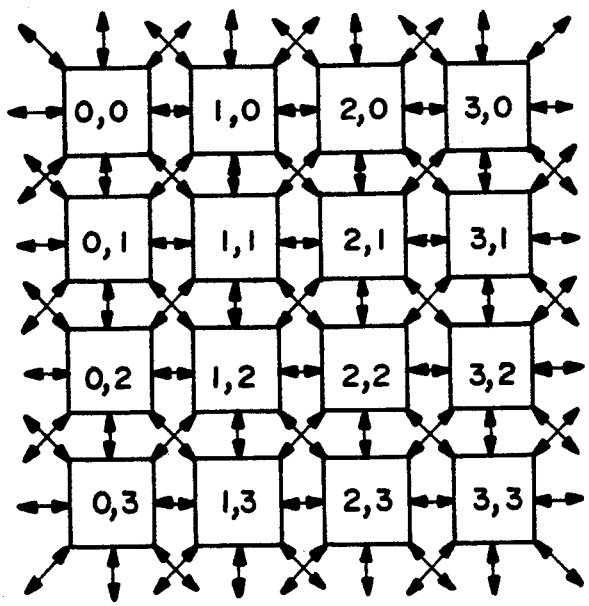
FIG. 2 is a diagram of the interconnections between sixteen node units forming part of the array shown in FIG. 1.

FIG. 2 shows 16 node units, each having an address in the form of an ordered pair of integers. The top left-hand unit has an address 0,0, the top right-hand unit has the address 3,0, the lower left-hand unit has the address 0,3 and the lower right-hand unit the address 3,3, for example. Interconnections are provided between the units, each unit being connected to the eight units surrounding it so that not only is a unit connected directly to those immediately adjacent to it in the same row and column but it is also connected directly to those adjacent to it in the four diagonal directions. With an arrangement of interconnections as shown in FIG. 2, it is necessary for the communications circuit in each unit to have eight input channels and eight output channels for the interconnections. The node unit to be described with reference to FIG. 4 uses only interconnections along the rows and columns of the array If a unit, such as that having the address 3,0 is at the edge of the array at least one of the channels of the communications circuit will be available for input/output connections if required, or may be used to connect to another array of node units.

Figure 3:
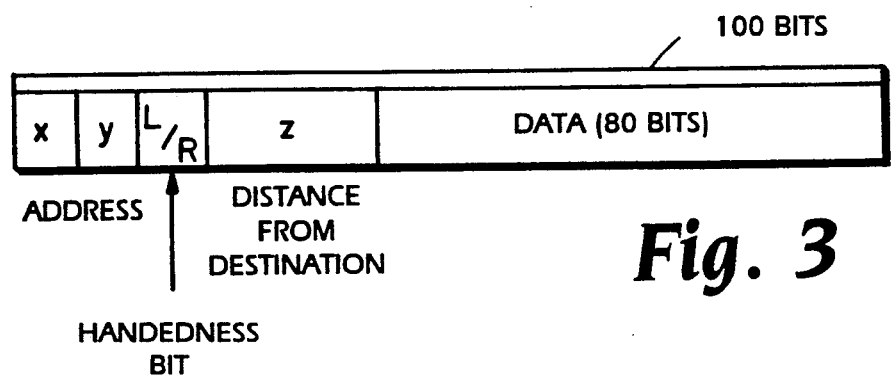
FIG. 3 is a diagram showing the structure of one example of a data packet.

In the operation of the array shown in FIG. 1 with the interconnections shown in FIG. 2, the processors in the units operate asynchronously and to a large extent independently of each other. When the processor in one unit has some information to be transferred to the processor in another unit it instructs its packet generation means to produce a data signal packet of the form shown in FIG. 3 for transmission to the other unit. As shown in FIG. 3, a packet contains 100 bits of which the first 6 bits constitute the X component of the address and the next 6 bits the Y component of the address. The 13th bit is a single bit termed the "handedness" bit, the use of which will be explained later The next 7 bits store the number Z which represents the distance of the packet from its destination; the generation and use of this will be described later. The remaining 80 bits of the packet are available for the data to be transferred from the originating processor to the destination processor A packet has two modes of movement, free and blocked In the free mode it follows a direct path to the destination node unit, and in the blocked mode it follows a path round one or more non-working mode units. A change from the free mode to the blocked mode is made when the packet meets a non-working node unit on its direct path to the destination. When this happens its distance Z from the destination is stored in the packet. In the blocked mode the distance Z is compared at each node unit with the distance of that node unit from the destination and if the packet is then nearer to the destination than the distance Z it reverts to the free mode.

Figure 4:
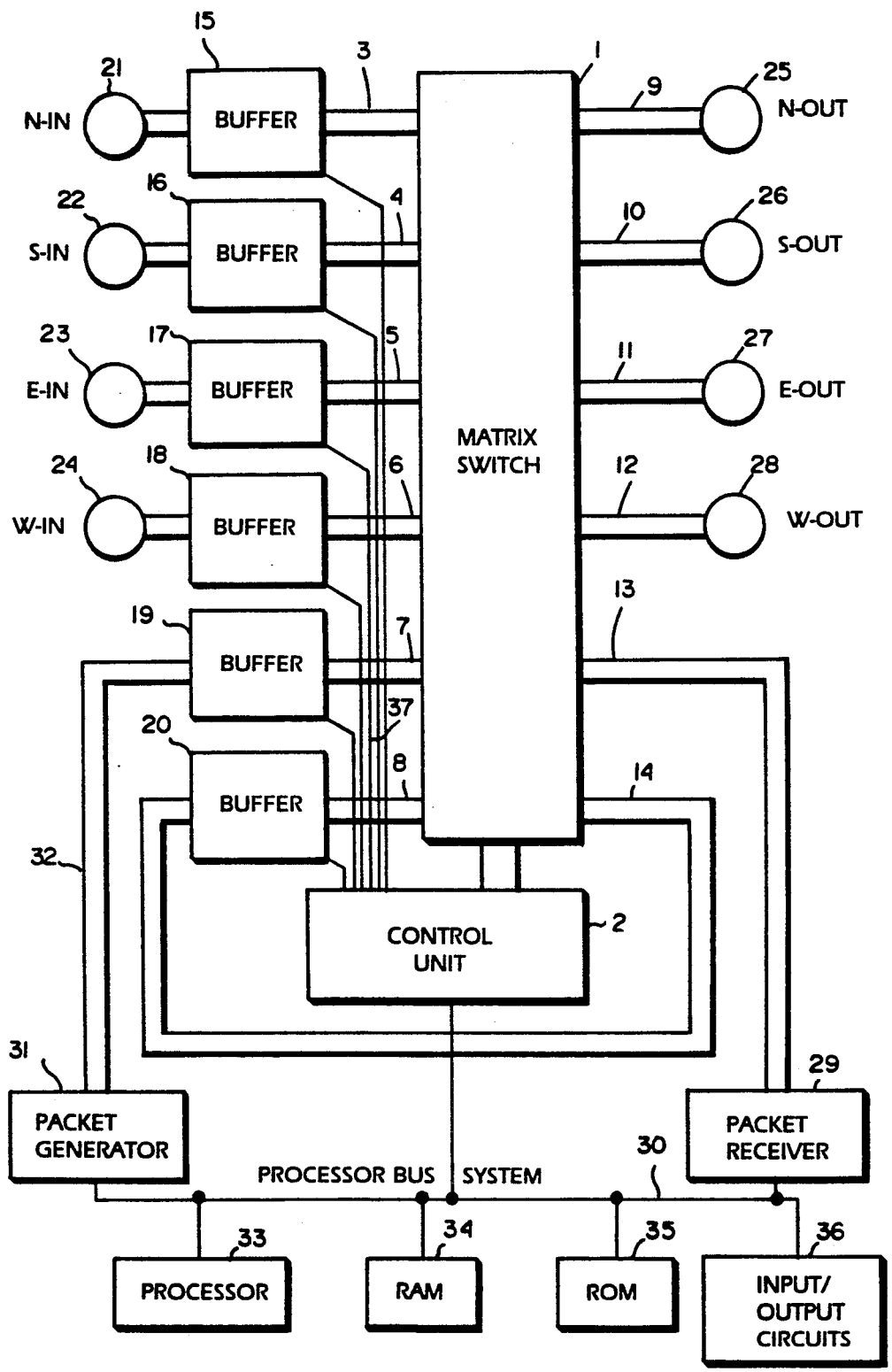
FIG. 4 is a block diagram of a simpler form of node unit which could be used in the array shown in FIGS. 1 and 2.

FIG. 4 shows in block diagrammatic form an example of a node unit. The communication circuit of this unit comprises a matrix switch unit 1, a control unit 2 for the matrix switch 1, six input channels 3, 4, 5, 6, 7 and 8 and 6 output channels 9, 10, 11, 12, 13 and 14. Connected to each of the input channels 3 to 8 is a buffer store 15, 16, 17, 18, 19 and 20. For simplicity in FIG. 4, provision for only four interconnections is made, these interconnections having input terminal systems 21, 22, 23 and 24 respectively for inputs from North, South, East and West interconnections. Terminal systems 25, 26, 27 and 28 provide the outputs for the North, South, East and West interconnections. The output channel 13 is connected to a packet receiver 29, which decodes a packet it receives and applies the data to a processor bus system 30. A packet generator 31 receives data from the bus system 30 and applies it via a channel 32 and the buffer 19 to the input channel 7 of the switch 1. The processor bus system 30 is connected to a processor 33, a random access memory 34, a read only memory 35 and input-/output circuits 36 which together form the processor circuit of the node unit. The control unit 2 of the matrix switch 1 is also connected to the bus system 30. A plurality of data links 37 are connected respectively from the buffers 15, 16, . . . 20 to the control unit 2. The output channel 14 is connected round to the input of the buffer 20 which as described above is connected to the input channel 8; the purpose of this loop is to provide storage for a packet when the one of the output channels to which the packet should be sent is temporarily busy so as to avoid a deadlock.

The control unit 2 includes a processor and performs the following functions:

(a) It stores:

1) the address of the node unit in which it is located;

2) the status of each output channel; this may be open, temporarily blocked, permanently blocked because there is no node unit or permanently blocked because the channel is connected to a non-working node unit.

(b) It reads the status of an output channel leading to the shortest path to the destination node unit for each incoming packet stored in one of buffers 15 to 20, to ascertain whether the output channel is open. If the output channel is not open it seeks for another output channel providing a reduction in the distance to the destination and if it finds one it selects it. It operates the matrix switch 1 to transmit the packet to the selected output channel.

(c) It receives from an incoming packet stored in one of the buffers 15 to 20 the address of its destination, its "handedness" bit and the distance Z from its destination as stored in the packet (d) It calculates from its own address and the address of the packet its distance from the destination; the distance may be calculated by adding together the differences between the X values and the Y values or by squaring those differences and taking the square root of the sum of the squares, for example, the distance may be calculated in other ways.

(e) If the distance stored in the packet is greater than the distance of the particular node unit from the destination, the control unit decides that the packet is in free mode and can be routed on a direct path to its destination as in (b) above unless those paths are blocked. If the packet can be routed on a direct path the distance stored in the packet is changed to 1111111, a value higher than any distance which could be encountered in the array.

(f) If it cannot find an open output channel providing a reduction in the distance of the packet to its destination in (b) above, it switches the packet from "free" to "blocked" mode by entering in the packet the distance to the destination as calculated in (a) above and seeks for an open output channel to the side of the direct paths to the destination as indicated by the "handedness" bit obtained by (c) above.

(g) On being switched on, it performs a self-test routine to check that all parts of the communications circuit are working. If the result of the testing is that all parts are found to be in working order, it transmits to the four neighbouring node units (North, South, East and West) an indication of this fact. It also awaits similar indications from the neighbouring node units. If no such indication is received from a particular node unit within a predetermined time interval it enters in a status register the fact that that particular node unit is non-working. Where indications are received the status register records the fact that the node units are working.

The matrix switch for a node unit having eight interconnections as shown in FIG. 2 will have four more input and output channels than the matrix switch shown in FIG. 4. Of course, the control unit 2 will be modified to handle the additional inputs and outputs and that extra status information. Other numbers of interconnections may be provided, especially where they suit different distributions of node units from the square array shown.

The matrix switch itself consists of row conductors and column conductors interconnected by switching transistors controlled by the control unit 2. In a particular form of the array, the packets are transmitted in parallel, which means that each of the channels 3 to 14 will be of 100 conductors in parallel and the buffer stores 15 to 20 capable of storing 100 bits. For this array, the matrix switch 1 will include 3,600 switching transistors enabling any one of the input channels to be connected to any one of the output channels. The control unit 2 is arranged so that no two input channels can be connected to the same output channel.

When a data packet is received on the terminal system 23 for example, the packet is stored in the buffer store 17 and the X and Y co-ordinates of the packet's destination together with its "handedness" bit and the distance Z from its destination stored in it are transferred via its one of the data links 37 to the control unit 2. The control unit calculates which of the output channels will provide the most direct path to the destination node unit and checks that the status of the selected output channel is that it is open. If that is the case, the matrix switch 1 is operated to connect the input channel 5 to the selected output channel, say 10. When the connection is complete, the control unit 2 sends a command via the data bus 37 to the buffer 17 instructing it to transmit the stored packet through the matrix switch 1 to the terminal system 26 via channels 5 and 10.

The control unit 2 stores the address of the node unit and compares this address with the address at the start of an incoming packet. If these agree, the matrix switch 1 is operated to connect the input channel to the output channel 13 so that when the control unit 2 reads the packet from the buffer, it is transferred to the packet receiver 29 which feeds the data from the packet into the processor bus system 30 for use by the data processor circuit connected to it.

When the data processor circuit has a packet of data to transmit, it is transferred through the bus system 30 to the packet generator 31 and from there along the channel 32 to the buffer 19. The control unit 2 examines the packet in the same way as an incoming packet and operates the matrix switch 1 accordingly.

If the status of the output channel selected by the matrix switch 1 is that it is temporarily blocked the packet may be transferred via the channel 14 into the buffer 20 to await the required output channel becoming free. In this way, deadlocks which might occur in the routing of packets due to the confluence of the paths taken by a large number of packets can be avoided. Such bottlenecks may occur if there are several non-working node units extending across the array which have to be circumvented by packets from many source node units being transmitted to many destination node units.

If the status of a selected channel is that it is permanently blocked, this may be due either to the particular node unit being at the edge of the array so that there is no node unit connected to the selected output channel or it may be that there is a node unit connected to the output channel but that it is not working. If there is a node unit and it is not working, then the control unit tries other output channels leading to a reduction in distance to the destination and selects the first one that is open. If no such channel is found then the control unit refers to the "handedness" bit of the packet and selects the output channel connected to the interconnection just to the left or just to the right of that leading to the non-working node units depending on whether the "handedness" bit is "0" or "1". When a packet cannot follow a direct path to its destination, it is in "blocked" mode and the control unit 2 calculates a measure of the distance of the particular node unit in which the packet is at the time from its destination and stores an indication Z of that distance in bits 14 to 20 of the packet The control units of the next node unit or units visited by the packet compare the destination in the packet with their own distance from the destination and as soon as it is found that the distance Z stored in the packet is greater than the distance calculated by the node unit of itself from the destination, the control unit resets the distance Z to a maximum value 1111111. Using the value 1111111 to indicate the "free" mode of a packet enables the same test to be used to ascertain whether the packet is to be routed according to its "handedness" or by a direct path to the destination.

If a packet in the blocked mode enters a node unit at the edge of the array, the "handedness" bit is changed over from 0 to 1 or 1 to 0 so that the packet retraces its path beside the non-working node units until it can find a path directly to its destination. In this way, the routing of a packet around the edge of the array is avoided.

Figure 5:
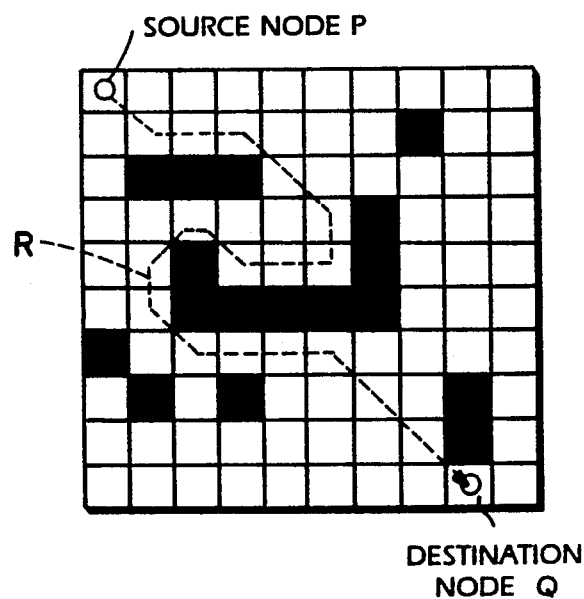
FIG. 5 shows the path taken by a data packet through part of an array.

FIG. 5 shows an example of a path followed by a packet from a source node P to a destination node Q. The path is shown as a dotted line R. As in FIG. 1 non-working node units are shown as black areas.

The addresses of the node units may be built into a read-only memory in the control unit when the circuitry is being fabricated on the semiconductor wafer Alternatively, the array may be set up by an initial program which causes a particular node unit to be given a reference address, the adjacent node units to derive their addresses from the reference address by adding or subtracting units from one or other or both of the pair of numbers depending on the position of the node unit relative to the particular node unit, and the more remote node units to derive their addresses in a similar way. The node units at the edge of the array receive an indication of their status as edge units at this time.

It would be possible to avoid having any edges to the array by interconnecting two or more wafers together at their edges, for example, two wafers placed back to back and interconnected all round their edges or four wafers on the faces of a tetrahedron.

The inputs and outputs from the array may be made through the processor circuits of selected node units round the edge of the array using the input/output circuits 36.

Figure 6:
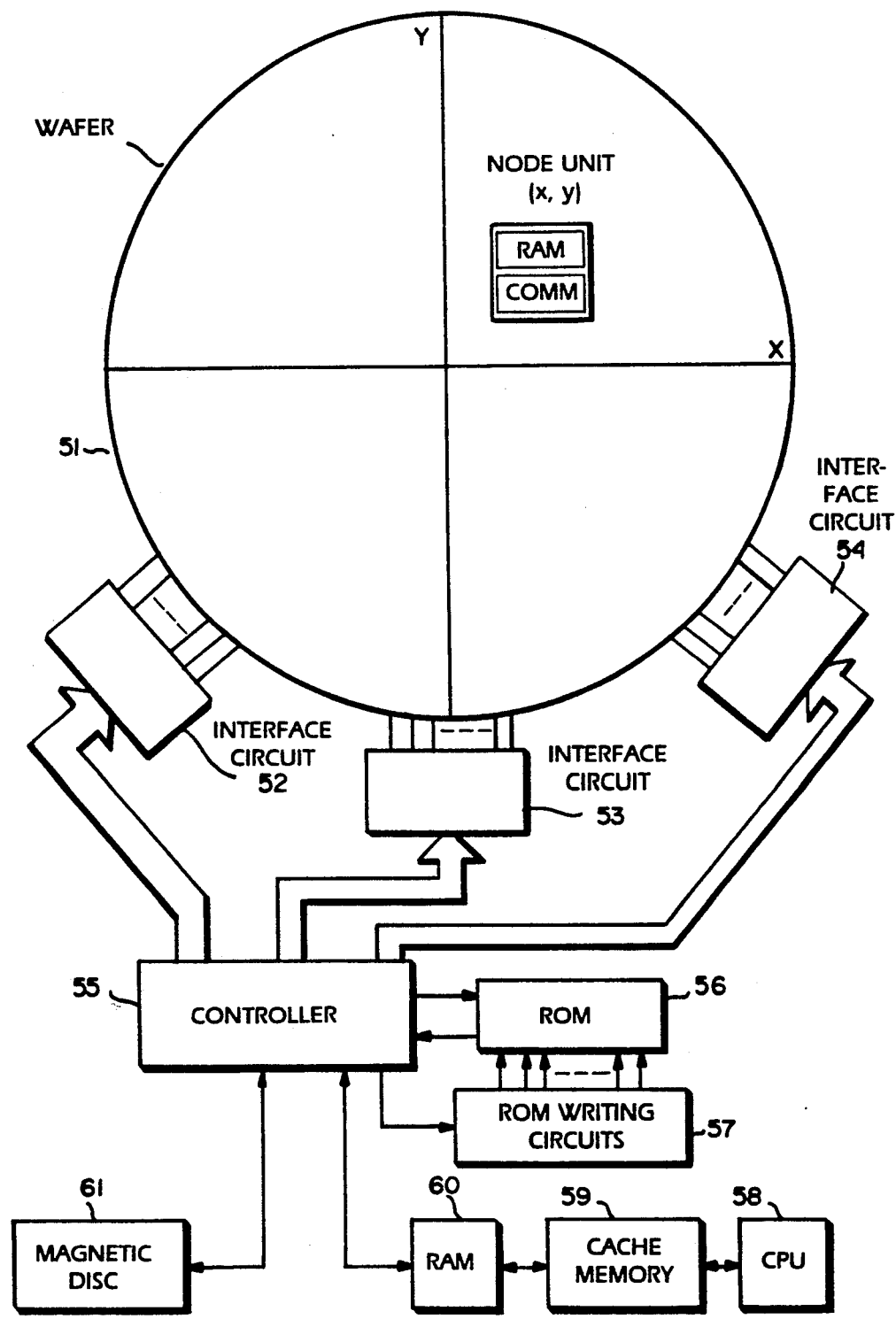
FIG. 6 shows the circuit of an array constructed to form a random access memory.

In a particular example of an array as shown in FIG. 6, the node units provide only communication means and sections of random access memory, so that the array can serve as a very large capacity random access memory having a mean access time, which is a little longer than that of much smaller random access memory but nevertheless much shorter than that of a magnetic disc memory otherwise used to provide memory of such capacity. The node units may conveniently be formed on a semiconductor wafer.

Although as described above all of the node units include processing circuits with the communications circuit, it is not essential that they should. For example, certain node units may include random access memory or read-only memory and addressing circuits only instead of the processing circuits. Other node units may include input and/or output circuits only instead of the processing circuits. In another example all the node units include only the communications circuit so that the array is just a switching network, with external data processing, memory and/or interfacing circuits connected to the node units. If the self-test shows that the communications circuit operates satisfactorily but the processing circuit of the particular node unit does not, a packet can be routed through the communications circuit to another node unit.

Although the communications technique described above enables data packets to circumvent faulty node units and is consequently of especial value in the use of wafer scale integrated circuits, it is not limited in its usefulness to such circuits but it can also be employed where the node units are constructed as separate entities. If a node unit failed in service, a self-test could be initiated automatically by adjacent node units (e.g. following a temporary blockage of long duration) and the appropriate changes made to the status of the interconnection channel so that the array could continue to function; this would be of value in equipment carried in artificial satellites.

The array may be constructed of node units of differing sizes and/or shapes with other numbers of interconnections between them. For example, the array may be composed of square or rectangular node units in a staggered arrangement like brickwork with six interconnections from each unit.

The format and/or number of bits in a data packet may be different from that described above. The packet may be transmitted from one node unit to the next in parallel as described above, in serial form, or as a series of groups (e.g. 8 bits) each sent in parallel.

Referring now to FIG. 6, a wafer 51 is connected through interface circuits 52, 53 and 54 to a controller 5. The controller 55 is connected to a ROM 56 and ROM writing circuits 57. The circuits 57 are connected to write data into the ROM 56. The data storage apparatus is connected as part of a hierarchy of memories to a central processing unit 58, a cache memory 59, a random access memory 60 and a magnetic disc memory 61. The CPU 58 is the processor of a computer and in addition to being connected to the memories shown would be connected to input/output circuits. In the hierarchy of memories of the computer, the cache memory 59 has a capacity of a few kilobytes and a very short access time of approximately 20 ns. The random access memory 60 typically has a capacity of several hundred kilobytes with an access time of about 100 ns. The capacity of the data storage apparatus consisting of the elements 51 to 57 is several tens of megabytes and provides a mean access time of about 5 us. The magnetic disc 61 has a capacity of several gigabytes with a mean access time of 10 ms. In the operation of the computer, data is transferred between memories in blocks of a predetermined size or of programmable size to permit the processor to operate on the stored data in the most efficient manner. A subsidiary processor may be provided for organising the transfer of the blocks of data between memories.

The wafer 1, which is as described above with reference to FIGS. 1 to 5, A carries a plurality of node units each having an x,y coordinate address. Near the edge of the wafer 51 certain of the node units may provide only communication from the interface units 52, 53 and 54 to the other units of the wafer. Most of the node units contain communications means and a section of random access memory. The communications means includes a communication circuit, digital data signal packet generation means and digital data signal packet reception means. Further details of the construction of the communications means are described with reference to FIG. 4. The random access memory in each node unit may be of any conventional integrated circuit form and if it is dynamic RAM then each node unit will include the necessary refresh circuits. The communications means in the node units of the wafer 51 organise themselves to provide communications from the interface circuits 52, 53 and 54 to all operative node units on the wafer.

The controller 55 operates to control the storage and retrieval of blocks of data in the wafer 1 and is connected to the ROM 56 which stores either details of the addresses of the operative node units of the wafer 51 or the addresses of the non-operative node units. Using the information stored in the ROM 56, the controller 55 is able to enter data into the RAM sections of operative node units on the wafer 51 and retrieve that data subsequently. The controller 55 does not store details of the communication paths within the wafer 51 since these are organised by the communication means of the various node units.

The controller 55 is programmed to execute a series of tests of the wafer 51 when the apparatus is first used, and as a result of these tests it receives information as to which of the node units is operational and which is non-operational This information is then recorded in the ROM 56 by the ROM writing circuits 57. A single controller 55 may control interfaces to several wafers like the wafer 51.

In an alternative form of the apparatus, the testing of the wafer may be performed by a special-purpose equipment before the wafer is installed and the details of the addresses of the operational or non-operational node units stored in a ROM by that equipment. Later when the wafer 51 is connected to the apparatus the ROM may be plugged into the controller 55

In an alternative arrangement, the wafer 51 may be connected to several controllers like the controller 55, each of which is connected to a different CPU. In this way the wafer can provide concurrent access to the data stored in it to the several CPU's of a multi-processor computer.

Within the wafer 51 the RAM sections of the different node units are accessed through a fault tolerant communications network provided by the communications means of the node units. Externally of the wafer 51 the controller 55 may provide for error correction, for example, by the use of redundancy to provide error correction coding of the data to be stored and subsequent checking and correction of the data after retrieval.

We claim:

1. A multiprocessor computer including a wafer scale integrated circuit array which comprises:
    a plurality of node units formed in a single slice of semiconductor material, each node unit including a communication circuit for routing messages, each message including a component representing the address of a destination node unit in the array, and;
    a network of interconnections between the communications circuits of the node units, wherein each communications circuit comprises
    input circuits for interconnections to the communications circuits of other node units, output circuits for interconnections to the communications circuits of other node units,
    switching means for selectively joining one of the input circuits to one of the output circuits, and
    control means for controlling the switching means responsive to the component of a received message to route the message to an appropriate output circuit whereby the message is transferred to a following node unit on a route to the destination node unit,
    said multiprocessor computer also including a plurality of other circuits formed separately from the wafer scale integrated circuit, a plurality of respective interface control circuits each connecting a respective other circuit to a node unit of the wafer scale integrated circuit, each other circuit comprising digital data message generation means for generating digital data messages, digital data message reception means for receiving digital data messages, and a CPU;
    the array comprising a plurality of memory nodes each including a section of random access memory, the CPUs being arranged to concurrently access the wafer scale integrated circuit to write data to the memory nodes as messages, and to read data from the memory nodes as messages.

2. Apparatus according to claim 1, wherein the switching means comprises a plurality of matrix switches, each having a plurality of inputs respectively connected to input circuits and a plurality of outputs respectively connected to output circuits, each message being transmitted as one or more groups of bits in parallel.

3. Apparatus according to claim 1, wherein each matrix switch comprises a plurality of row conductors joined to a plurality of column conductors at their crossing points by individual transistor switches controlled by the control means.

4. Apparatus according to claim 1, wherein the switching means comprises a plurality of input buffer stores, a plurality of output buffer stores, and a common bus system interconnecting the input buffer stores and the output buffer stores, the control means determining from which input buffer store data are applied to the bus system and which output buffer store receives data form the bus system.

5. Apparatus according to claim 1, wherein the control means of each particular node unit includes means for reading the address component of a received message, and means responsive to that address component and to the address of the particular node unit to determine whether the received message is to be retained or whether it is to be passed on and, if it is to be passed on, to select the interconnection apparently providing the most direct path to the destination node unit.

6. Apparatus according to claim 1, arranged to perform a self test routine automatically when the control means is switched on.

7. Apparatus according to claim 1, in which the interface control circuits are arranged for controlling the storage of data in the array and the retrieval of data from the array, the interface control circuits storing address information relating to an operational status of the node units in the array.

8. Apparatus according to claim 1, wherein when it is first used an interface control circuit tests all of the node units in the array to ascertain which of them is operative.

9. Apparatus according to claim 1, wherein each controller includes a read only memory storing the addresses of an operative or non operative node units.

10. Apparatus according to claim 1, further comprising a heirarchy of memories in which the CPUs are connected to the wafer scale integrated circuit via faster memory units.

11. Apparatus according to claim 10, wherein said faster memory units comprise a cache memory and a random access memory slower than said cache memory and faster than the wafer scale integrated circuit.

12. Apparatus according to claim 10, further comprising a magnetic disc memory slower than said integrated circuit.

13. Apparatus according to claim 1, in which the integrated circuit comprises optical circuits.

14. Apparatus according to claim 1, in which each controller provides error correction coding of the data to be stored and subsequent checking and correction of the data after retrieval.

15. A wafer scale integrated circuit array which comprises:
    a plurality of node units formed in a single slice of semiconductor material, each node unit including a communication circuit for routing messages, each message including a component representing the address of a destination node unit in the array, and;
    a network of interconnections between the communications circuits of the node units, wherein each communications circuit comprises
    input circuits for interconnections to the communications circuits of other node units,
    output circuits for interconnections to the communications circuits of other node units,
    switching means for selectively joining one of the input circuits to one of the output circuits, and
    control means for controlling the switching means responsive to the component of a received message to route the message to an appropriate output circuit whereby the message is transferred to a following node unit on a route to the destination node unit,
    further comprising a plurality of interface circuits connected to a corresponding plurality of said nodes and interfacing to a plurality of external devices,
    in which said control means is arranged to operate said wafer scale integrated circuit array as a switching device for switching messages between said plurality of external devices.

* * * * *